United States Patent [19]

Braun et al.

[11] Patent Number: 4,764,759

[45] Date of Patent: Aug. 16, 1988

[54] OPEN CIRCUIT DETECTOR FOR DIFFERENTIAL ENCODER FEEDBACK

[75] Inventors: James W. Braun; John A. Hubert, both of Cincinnati, both of Ohio

[73] Assignee: Cincinnati Milacron Inc., Cincinnati, Ohio

[21] Appl. No.: 916,261

[22] Filed: Oct. 7, 1986

[51] Int. Cl.$^4$ ............................................. G08B 21/00
[52] U.S. Cl. .................................. 340/653; 340/652; 340/870.28; 307/500
[58] Field of Search ................................ 340/652–654, 340/664, 870.28; 324/96; 307/242, 500

[56] References Cited

U.S. PATENT DOCUMENTS

| | | | |
|---|---|---|---|
| 3,611,338 | 10/1971 | Kramer | 340/248 |
| 3,873,979 | 3/1975 | Craford et al. | 324/96 |
| 3,964,020 | 6/1976 | Dickerson | 340/654 |
| 4,155,080 | 5/1979 | Kovacs | 340/595 |
| 4,250,501 | 2/1981 | Pokrandt | 340/664 |
| 4,421,976 | 12/1983 | Jurek | 219/506 |

OTHER PUBLICATIONS

Product Brochure—General Electric Solid State OPTO Electronics—AC Input Photon Coupled Isolator H11AA1–H11AA4, particularly the applications described at p. 233.

Primary Examiner—John W. Caldwell, Sr.
Assistant Examiner—Tyrone Queen
Attorney, Agent, or Firm—Wood, Herron & Evans

[57] ABSTRACT

An apparatus is provided for self-monitoring a communication circuit incorporating a differential driver for malfunctions with a malfunction detector located remote from the driver. The malfunction detector monitors the state of signals received at the remote location on a pair of lines coupled to the driver. Preferably, the detector includes a pair of back-to-back light emitting diodes, one of which will emit light so long as the received signals are in opposite states, and neither of which will emit light when the received signals are not in opposite states as will occur during a malfunction. The dection further preferably includes a phototransistor responsive to the diodes to provide a malfunction signal when neither diode emits light. Alternatively, the detector may comprise an exclusive-OR logic gate.

4 Claims, 1 Drawing Sheet

4,764,759

OPEN CIRCUIT DETECTOR FOR DIFFERENTIAL ENCODER FEEDBACK

BACKGROUND OF THE INVENTION

I. Field of the Invention

This invention relates to a communication circuit with malfunction self-monitoring, especially in connection with such a circuit utilized in monitoring movement of a machine member wherein the communication lines may be moving and subject to stress, fatigue and the like.

II. Description of the Prior art

Communication circuits are employed in many situations. By way of example, such a circuit may be utilized in a numerical control (NC) machine to permit communication between a drive mechanism and a remote control unit. As is well known, positioning of movable members of a machine tool may be accomplished by communicating command signals from a computer control unit or the like to a drive mechanism which controls the motion. As is similarly well known, the control unit receives a plurality of feedback signals from encoders coupled to the drive mechanism, which feedback signals indicate the actual placement and positioning of the member.

Typical of microprocessor systems in use today is that the command and feedback signals are digital, i.e., they will alternate between preassigned, opposite binary states. Because the machine and the control unit may be spaced very far apart, e.g., one hundred feet or more, communication circuits have been employed to communicate the signals therebetween. For example, to couple a feedback signal to the control unit, a typical communication circuit will include a pair of electrical lines or wires (usually twisted together for noise reduction reasons into a twisted pair) which are driven by a differential driver, the input of which is a digital feedback signal. As is well known, the differential driver will therefore drive the pair of lines such that they are not in the same state at the same time, one line driven with a signal in a state correlated to the state of the input signal, the other line driven with a signal in a different or opposite state. The twisted pair of lines may be several tens of feet long and will typically be coupled to a differential receiver at the control unit which properly amplifies and decodes the now weakened, opposite state, differential feedback signals to generate control signals for use by the control unit.

Thus, as mentioned, the twisted pair lines may be extremely long, perhaps more than one hundred feet long. Moreover, at least a portion of the lines may be moving with the machine member and thus are subject to malfunction brought about by stress, fatigue or the like. In particular, the lines in a twisted pair may short-circuit to each other, or the wires or a line may short-circuit to ground or supply or may open-circuit.

Without the ability to verify the integrity of the communication lines, the determination of a malfunction in transmission of signals produced by encoders is impractical because certain malfunctions can not be distinguished from correct operation.

As will be appreciated, failure to detect an open- or short-circuit may result in a loss of feedback from the encoder thereby leading to loss of control of the machine tool member with potentially adverse consequences.

SUMMARY OF THE INVENTION

The present invention provides an apparatus for self-monitoring of the communications circuit particularly as it is used in the feedback circuit of an NC machine tool or the like to monitor the movement of the machine member. In its broadest sense the invention provides on apparatus which monitors a pair of lines remote from a differential driver for the presence of signals in different states. Should the signals received at the remote point not be in the different states, in accordance with the teachings of the present invention, a malfunction will be indicated.

In a preferred embodiment, the apparatus for detecting a malfunction includes a pair of back-to-back light emitting diodes coupled between the pair of lines adjacent the ends thereof remote from the driver and adapted so that at least one of the diodes will emit light whenever the received signals are in different states. Further, the preferred embodiment provides a phototransistor adapted to receive light from either of the diodes to provide a malfunction signal when the phototransistor detects absence of light from both diodes such as will occur when the lines are short-circuited to each other (no potential difference across the diodes), if a line is shorted to ground or the supply, or if a line is open-circuited, any of which may result, for example, from stress on the lines from movement with the machine member. In an alternative embodiment, the apparatus of the present invention provides an exclusive-OR (XOR) logic gate wherein the two inputs thereof are coupled to respective remote ends of the two lines. The logic gate is adapted to provide a malfunction signal when the received signals are not in the different states.

The foregoing provides an apparatus whereby a single communication circuit including a pair of differentially driven lines may be self-monitored for malfunctions without the need for complex comparison or relationship checking with any other communications circuit.

These and other objects and advantages of the present invention shall be made apparent from the accompanying drawings and the description thereof.

BRIEF DESCRIPTION OF THE DRAWINGS

The accompanying drawings, which are incorporated and constitute a part of this specification, illustrate a preferred and an alternative embodiment of the invention and, together with the general description given above, and the detailed description of the embodiments given below, serve to explain the principles of the invention.

DESCRIPTION OF THE PREFERRED EMBODIMENT

Figure 1:
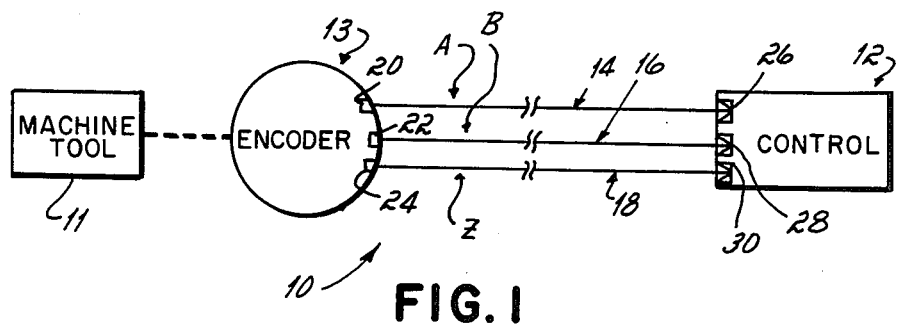
FIG. 1 is a schematic diagram of a plurality of communication feedback circuits employed in an encoder system such as used for monitoring movement of a machine tool member.

In FIG. 1 there is illustrated schematically an encoder feedback circuit 10 by which positioning of machine tool member 11 may be communicated to a control unit 12 spaced several feet from member 11. As member 11 is moved, an encoder 13 coupled thereto will generate three feedback signals (A, B, and Z) along communication circuits denominated A, B, and Z. These feedback signals will be conveyed over respective twisted pair lines 14, 16, and 18, at least a portion of which may also be moveable along with member 11. While only one encoder 13 is shown, each machine will typically utilize several such encoders and communication circuits.

In operation, as member 11 moves, encoder 13 will generate digital feedback signals A, B, and Z indicative of the position of member 11. These signals A, B, and Z are coupled to the inputs of respective drivers 20, 22, and 24. Each of the drivers 20, 22, and 24 will generate on their outputs differential signals to be coupled to a respective twisted pair of lines 14, 16, and 18 for communication thereby to a respective differential receiver 26, 28, and 30. Each of the differential receivers 26, 28, and 30 will then amplify and decode the received signals to generate a respective single-ended control signal correlated to the respective feedback signal A, B, Z generated by encoder 13.

Figure 2:
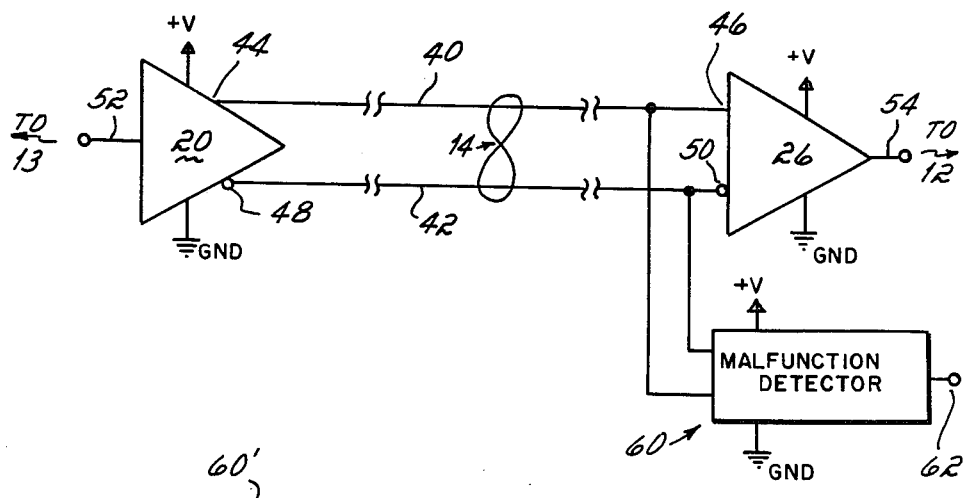
FIG. 2 is a schematic diagram of one of the communication circuits of FIG. 1 with malfunction self-monitoring according to the present invention.

With reference to FIG. 2, there is shown for explanation purposes an exemplary communication circuit corresponding to the communication circuit denominated A in FIG. 1. It will be appreciated that the circuit of FIG. 2 may be replicated with respect to the communication circuits for each of circuits B and Z of FIG. 1 and for other encoder communication circuits (not shown) utilized by the machine. Thus, for purposes of describing the invention, the circuit of FIG. 2 includes differential driver 20 coupled by twisted pair 14 to differential receiver 26, but could as readily be described by reference to driver 22, line 16 and receiver 28, for example.

Twisted pair 14 comprises first communication line 40 and second communication line 42. Line 40 is coupled between first output 44 of differential driver 20 and first input 46 of differential receiver 26. Similarly, line 42 is coupled between second output 48 of differential driver 20 and second input 50 of differential receiver 26. Preferably, feedback signal A is coupled to input 52 of differential driver 20 to be communicated to control unit 12. In the absence of a malfunction, output 54 of differential driver 26 will be a digital control signal which is as nearly as possible a replica of the digital feedback signal at input 52.

As is well understood, digital signals such as feedback signal A will fluctuate between two respective states "1" and "0" corresponding to maximum and minimum (binary) voltage levels or current flows. The former, for example, may refer to a positive supply of voltage (+V) and ground (GND), respectively. The latter, for example, may refer to a source or sink for current. As will be readily appreciated, differential driver 20 will provide on output 44 first signals which will be in either of a first or a second state corresponding to the state of feedback signal A on input 52. Similarly, output 48 will provide second signals which will also be in a first or second state. However, as will be appreciated by those skilled in the art, a differential driver such as driver 20 will provide the second signals on second output 48 in a state opposite the state of signals provided on first output 44 at any given time. That is, if first signals provided by first output 44 are in the first or maximum state (e.g., current source), second signals provided by second output 48 will be in the second or minimum state at that time (e.g., current sink). While these states may refer to either voltage levels or current flows, reference is preferably made to current flows in communication circuits such as that shown in FIG. 2

Coupled between lines 40 and 42 remote from outputs 44 and 48 (i.e., near inputs 46 and 50) is malfunction detector circuit 60 which will provide on output 62 a malfunction indicator if received signals adjacent inputs 46 and 50 are not in the opposite state as they should be. Such a situation may arise if, for example, either of lines 40 or 42 were to open-circuit, short-circuit to one another, or short-circuit to ground or to the supply voltage. Such a malfunction might occur as the lines are stressed or fatigued due to repeated flexing thereof while they move with member 11. Detailed operation of malfunction detect circuit 60 will now be explained with reference to FIGS. 3 and 4.

Figures 3, 4:
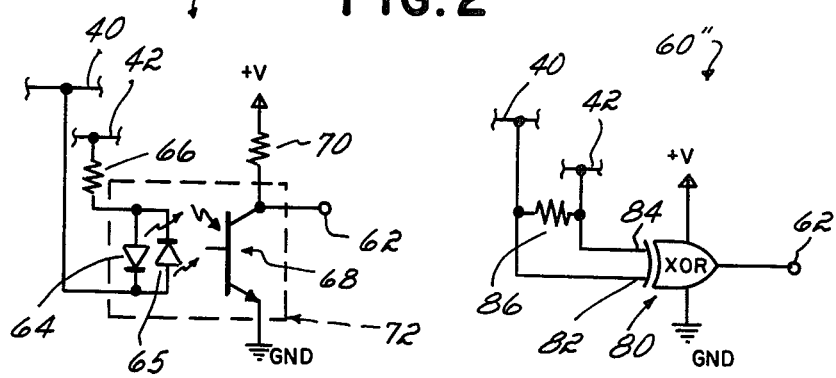
FIG. 3 is a schematic diagram of a preferred embodiment of the malfunction detector of FIG. 2.
FIG. 4 is an alternative embodiment of the malfunction detector of FIG. 2.

With reference to FIG. 3, there is shown a preferred embodiment 60' of malfunction detector 60. Preferred malfunction detector 60' includes a pair of back-to-back light emitting diodes 64 and 65 (i.e., the anode of one diode is coupled to the cathode of the other diode). The parallel combination of diodes or LED's 64 and 65 is coupled in series through termination resistor 66 to lines 40 and 42. Malfunction detector 60' further includes phototransistor 68 adapted to receive light from both of diodes 64, 65. Phototransistor 68 is preferably an NPN transistor the emitter of which is grounded and the collector of which is coupled through a bias resistor 70 to a source of supply (+V). The collector of transistor 68 is further coupled to output 62 of the malfunction detector 60'.

Termination resistor 66 must be selected to terminate lines 40 and 42 in the impedance matching the characteristic impedance of the twisted pair. The termination resistor 66 defines the current available to drive light emitting diodes 64 and 65. Applicants have chosen an optical coupler 72 including the LED's 64 and 65 and the phototransistor 68. The optical coupler, generally referred to as an optoisolator, is chosen to provide the needed current transfer ratio to achieve the desired output signal characteristics. In a preferred embodiment, the optoisolator is part No. H11AA1 available from General Electric. This particular integrated circuit 72 has a current transfer ratio of approximately 20 percent.

Determination of the minimum value of collector resistor 70 is by the following formula:

$$I_c = I_f \times CTR$$

where $I_c$=collector current of transistor 68, $I_f$=the current through resistor 66 and CTR=current transfer ratio. As mentioned, the CTR of preferred circuit 72 is approximately 20 percent. In the preferred embodiment, +V is approximately 5 volts and resistor 70 is approximately 10 kilohms. It has been determined that with a Fairchild Semiconductor Part No. 9638 as driver 20, and a Fairchild Semiconductor Part No. 9637A as receiver 26, termination resistor 66 is preferably about 150 ohms to match the characteristic impedance of the twisted pair.

In the operation of the preferred embodiment 60', the first and second signals provided on outputs 44 and 48, respectively, will be in opposite states during normal operation. Thus, the first and second signals, coupled through lines 40 and 42, respectively, will be received at inputs 46 and 50, respectively, such that one is in a first state (e.g., maximum) while the other is in a second state (e.g., minimum). Thus, under normal circumstances, current will flow between lines 40 and 42 through diodes 64 and 65 and resistor 66 thereby causing one of diodes 64 and 65 to emit light. As used herein, light refers to energy emitted by the diodes whether in the visible spectrum or not and may include infrared light as well. So long as light is emitted by one of the diodes, phototransistor 68 will be biased on, thus driving output 62 towards ground.

Should one or both of lines 40 or 42 open-circuit, current will no longer flow in preferred embodiment 60' and neither of diodes 64 or 65 will emit light. Consequently, phototransistor 68 will detect absence of light from both diodes and will, therefore, be driven towards cut-off (output 62 will be driven towards +V). Output 62, when driven toward +V, provides a malfunction signal. Similarly, if either of lines 40 or 42 should short-circuit to ground or the line supply voltage, there will be periods of time during which one of diodes 64 and 65 will emit light and periods of time during which neither will emit light as the signals on lines 40 and 42 toggle between the first and second states in response to the changing states of feedback signal A at input 52. Under these conditions, output 62 will be periodically driven toward +V to provide a malfunction signal. Output 62 may be coupled to a latch or other similar circuit (not shown) whereby any period during which both diodes 64 and 65 do not emit light will cause a temporary malfunction signal on output 62 which may be latched or stored for subsequent evaluation or utilization by control unit 12. Finally, if lines 40 and 42 are short-circuited to one another, no potential difference will exist across the LED's 64 and 65 and neither will emit light thus producing the malfunction signal.

The preferred embodiment has the further advantage that failures or malfunction in either driver 20 or diodes 64 and 65 will similarly cause a malfunction signal to be generated on output 62, thus providing a communication circuit which is not only malfunction self-monitoring, but in which the malfunction detecting circuit and active driver device are likewise monitored for malfunction.

An alternative embodiment 60" of malfunction detector 60 is shown in FIG. 4 and comprises an exclusive-OR (XOR) logic gate 80. First input 82 of gate 80 is coupled to line 40 and second input 84 thereof is coupled to line 42. Coupled across inputs 82 and 84 is a resistor 86, which is preferably 150 ohms to terminate lines 40 and 42.

As is well understood, logic gate 80 provides an output signal on output 62 which will be in a true state (e.g., +V or "1") only when its inputs are coupled to signals of opposite states. If both inputs are in the same state, the output signal on output 62 will be in a false or malfunction state (e.g., GND or "0"). It will be appreciated that termination resistor 86 not only terminates lines 40 and 42 to provide the correct impedance therefor, but may also function to provide a pull-up or pull-down resistor to the respective inputs of gate 80 should the line to which that input is coupled become open-circuited. In this manner, neither input 82 nor input 84 will be permitted to "float" causing erratic operation of gate 80. Rather, in the event of an open-circuit of one line, the input coupled to that line will be "pulled" to the same state as the state of the non-open-circuited line by resistor 86, i.e., both inputs will be in the same state resulting in a malfunction signal on output 62.

In operation of detector 60", when the communication circuit shown in FIG. 2 is operating properly, the driver signals as received at inputs 82 and 84 will be in the opposite states thus generating the normal signal on output 62. However, in the event of an open- or short-circuit of either of lines 40 or 42 as before described, there will be at least some period of time during which inputs 82 and 84 are not in opposite states thus causing output 62 to provide the malfunction signal to control unit 12.

In a long distance communication circuit such as that for which the invention was originally developed, rise times of signals received adjacent inputs 46 and 50 may result in undesired malfunction detection by logic gate 80 either because the required levels are not reached at or above some signal frequency or because of level ambiguity during the transition from one state to another. Thus, the embodiment of FIG. 3 is preferred.

Also, logic elements such as gate 80 will typically respond more rapidly than the back-to-back photodiode approach of FIG. 3 and, hence, as the driven signals on lines 40 and 42 switch or toggle between states, there may be momentary instances where the received signals will not be in opposite or different states. This period is so brief as to not interfere with operation of light emitting diode-based malfunction detector 60' of FIG. 3. However, the inputs to faster-responding gate 80 may momentarily see received signals in the same state. This brief time or "glitch" will generate a momentary malfunction signal on output 62 of detector 60". As a result, the embodiment 60" of FIG. 4 may require extra circuitry (not shown) to filter the glitch to avoid providing erroneous malfunction signals to control unit 12.

While the present invention has been illustrated by the description of the preferred and alternative embodiments and while the embodiments have been described in considerable detail, it is not the intention of the applicants to restrict or any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. A digital communication circuit with malfunction self-monitoring, the circuit comprising:
   (a) a differential driver responsive to a digital input signal for producing first output signals and second output signals, the first and second output signals being simultaneously in opposite states;
   (b) a differential receiver responsive to the first and second output signals for producing a digital output signal;
   (c) a pair of conductors for conducting the first and second output signals from the differential driver to the differential receiver: and
   (d) a malfunction detector connected to the pair conductors adjacent to the differential receiver and including an optical coupler having a pair of back-to-back light emitting diodes adapted so that one or the other emits light so long as the first and second output signals transmitted to the diodes are in opposite states, and having a photo transistor optically coupled to the pair of diodes and adapted to produce a malfunction signal in response to absence of light from the pair of diodes indicative of a malfunction.

2. The circuit of claim 1 wherein the malfunction detector further includes a terminating resistor for terminating the pair of conductors in a characteristic impendance thereof.

3. A position encoder feedback circuit with malfunction self-monitoring, the circuit comprising:
 (a) encoder means for producing digital feedback signals correlated to a position measured by an encoder;
 (b) a differential driver responsive to the digital feedback signals for producing first output signals and second output signals, the first and second output signals being simultaneously in opposite states;
 (c) a differential receiver responsive to the first and second output signals for producing digital output signals correlated to the digital feedback signals;
 (d) a pair of conductors for conducting the first and second output signals from the differential driver to the differential receiver; and
 (e) a malfunction detector connected to the pair of conductors adjacent to the differential receiver and including an optical coupler having a pair of back-to-back light emitting diodes adapted so that one or the other of said diodes emits light so long as the first and second output signals transmitted to the diodes are in opposite states, and having a photo transistor optically coupled to the pair of diodes and adapted to produce a malfunction signal in response to an absence of light from the pair of diodes indicative of a malfunction.

4. The circuit of claim 3 wherein the malfunction detector further includes a terminating resistor for terminating the pair of conductors in a characteristic impedance thereof.

* * * * *